(12) United States Patent
Koga et al.

(10) Patent No.: US 6,570,193 B1
(45) Date of Patent: May 27, 2003

(54) REVERSE CONDUCTING THYRISTOR DEVICE, PRESSURE-CONNECTION TYPE SEMICONDUCTOR DEVICE AND SEMICONDUCTOR SUBSTRATE

(75) Inventors: Shinji Koga, Tokyo (JP); Kazuhiro Morishita, Fukuoka (JP); Katsumi Satoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/612,963

(22) Filed: Jul. 10, 2000

Related U.S. Application Data

(63) Continuation of application No. PCT/JP98/05090, filed on Nov. 11, 1998.

(51) Int. Cl.[7] .............................................. H01L 29/74
(52) U.S. Cl. ...................... 257/138; 257/147; 257/153; 257/161
(58) Field of Search ................................ 257/107–182

(56) References Cited

U.S. PATENT DOCUMENTS

| | | | | |
|---|---|---|---|---|
| 4,261,001 A | * | 4/1981 | Temple | 357/38 |
| 4,717,947 A | * | 1/1988 | Matsuda et al. | 357/38 |
| 4,791,470 A | | 12/1988 | Shinohe et al. | |
| 4,943,840 A | | 7/1990 | Roggwiller | |
| 5,777,506 A | | 7/1998 | Kurachi et al. | |
| 5,835,985 A | * | 11/1998 | Hiyoshi et al. | 257/121 |
| 6,049,096 A | * | 4/2000 | Bernier | 257/173 |

FOREIGN PATENT DOCUMENTS

| | | | | |
|---|---|---|---|---|
| JP | 49-45691 | | 5/1974 | |
| JP | 61-144065 | | 7/1986 | |
| JP | 405152564-a | * | 6/1993 | 257/138 |
| JP | 5-343663 | | 12/1993 | |

* cited by examiner

Primary Examiner—Eddie Lee
Assistant Examiner—Paul E Brock, II
(74) Attorney, Agent, or Firm—Oblon, Spivak, McClelland, Maier & Neustadt, P.C.

(57) ABSTRACT

The present invention relates to a reverse conducting thyristor device. It aims at preventing heat generated by power loss from filling end field protective rubber and at simplifying a sheath storing a semiconductor substrate. In a reverse conducting thyristor device according to this invention, a self-extinguishing thyristor region is arranged on an inner region of the semiconductor substrate, a reverse conducting diode region whose outer periphery is completely enclosed with an isolation region is arranged on its outer region by at least one, and an external takeout gate electrode region is further arranged on the outermost peripheral region of the semiconductor substrate on the outer part thereof. Thus, a gate electrode provided on a surface of a gate part layer of the self-extinguishing thyristor region is connected with an external takeout gate electrode formed along the outermost periphery of the substrate through a gate wiring pattern formed on a surface of a connecting region.

8 Claims, 21 Drawing Sheets

F I G. 2
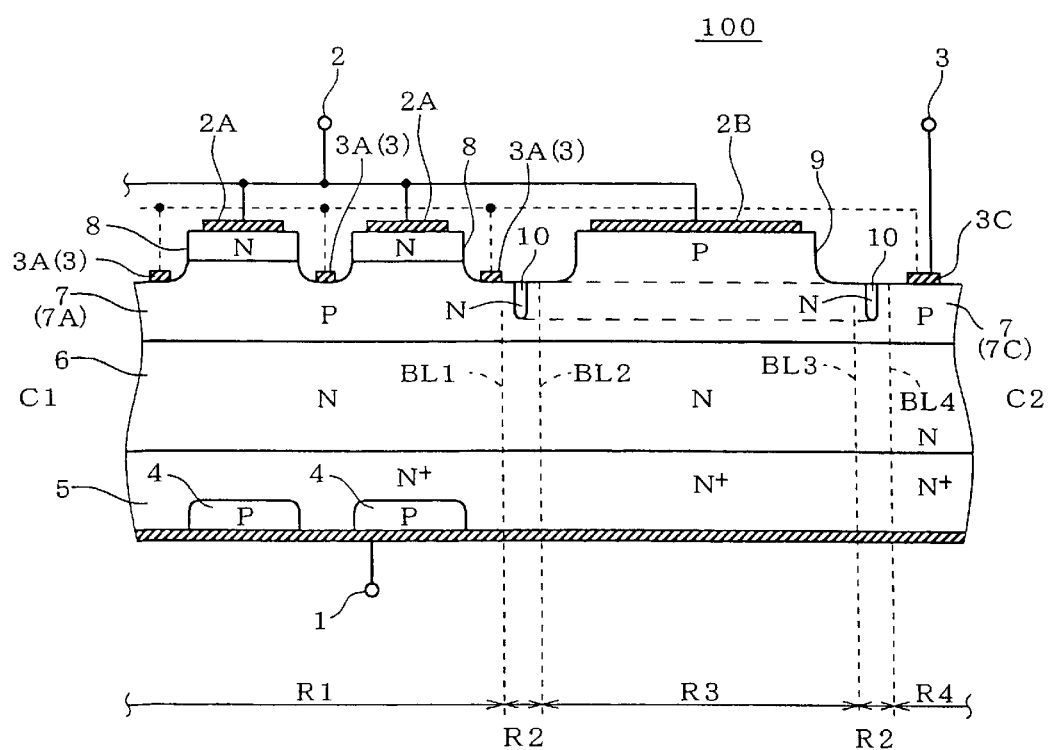

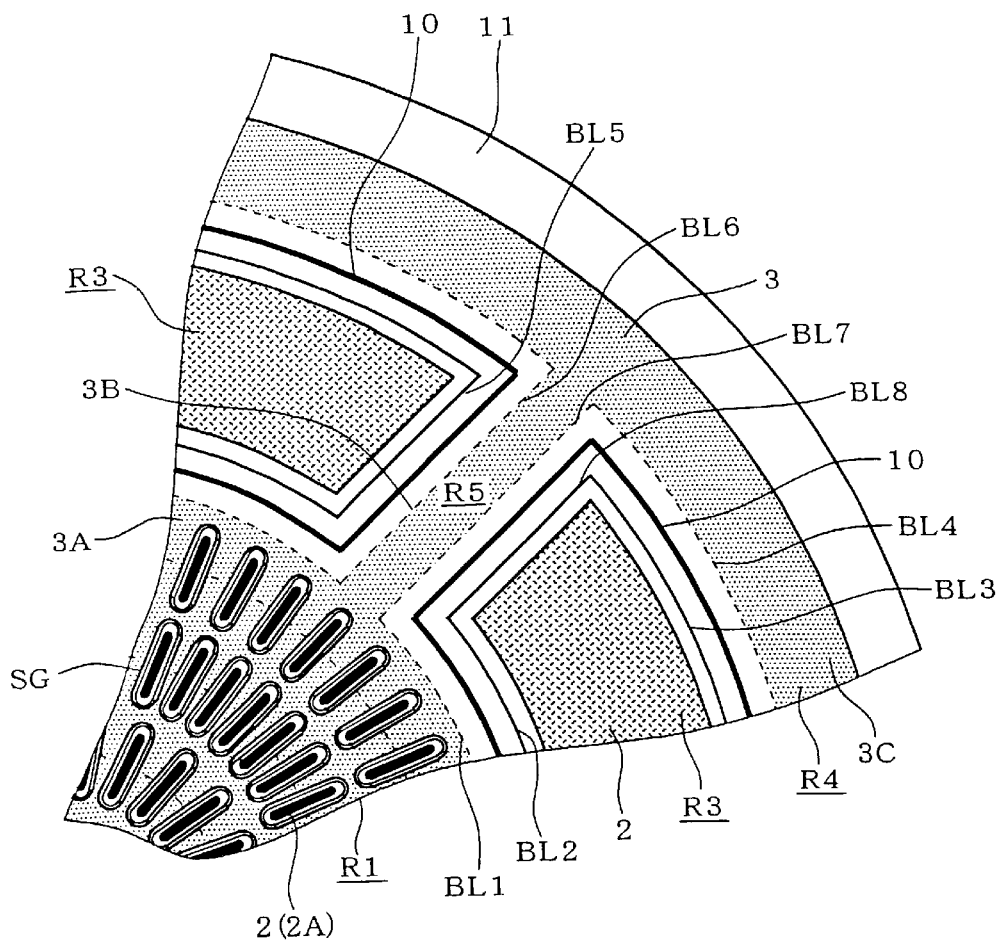
F I G . 6

US 6,570,193 B1

REVERSE CONDUCTING THYRISTOR DEVICE, PRESSURE-CONNECTION TYPE SEMICONDUCTOR DEVICE AND SEMICONDUCTOR SUBSTRATE

This is a continuation of PCT/JP98/05090, filed Nov. 11, 1998.

TECHNICAL FIELD

The present invention relates to a self-extinguishing thyristor having a built-in reverse conducting diode.

BACKGROUND ART

The structure of a GTO (Gate Turn off) thyristor having a built-in reverse conducting diode, i.e., a reverse conducting thyristor device is disclosed in literature such as U.S. Pat. No. 4,943,840 (EP No. 224757B1) or U.S. Pat. No. 4,791,470 (Japanese Patent Laying-Open Gazette No. 61-144065), for example.

BACKGROUND ART 1

FIG. 18 is a plan view of a reverse conducting thyristor device of background art 1. A reverse conducting diode region 101 is arranged on an inner region of a semiconductor substrate and a high-resistance region 102 and a self-extinguishing thyristor region 103 are successively formed on an outer region thereof toward the outer peripheral end of the semiconductor substrate, while part of the outermost peripheral region of the semiconductor substrate is engaged in a concave portion of end field protective rubber 104. An external takeout gate electrode region 105 is provided on an inner portion in the self-extinguishing thyristor region 103. FIG. 19 is a sectional view of the reverse conducting thyristor device of the background art 1, and corresponds to a longitudinal sectional view related to the line A–A' shown in FIG. 18. A cathode electrode and an anode electrode of the reverse conducting diode region 101 consisting of a P-N-N+ layer are in common with an anode electrode 106 and a cathode electrode 107 of the self-extinguishing thyristor region 103 consisting of a P-N+-N-P-N layer respectively.

PRIOR ART 2

FIG. 20 is a plan view of a reverse conducting thyristor device of prior art 2. A reverse conducting diode region 101 is arranged on the innermost region of a semiconductor substrate and a high-resistance region 102 and a self-extinguishing thyristor region 103 are successively formed on its outer side toward the outer peripheral end of this substrate, while end field protective rubber 104 is provided on the outer peripheral end of this substrate. An external takeout gate electrode region 105 is provided on an outer portion of the self-extinguishing thyristor region 103. FIG. 21 is a longitudinal sectional view of the reverse conducting thyristor device of the prior art 2 related to the line A–A' in FIG. 20. A cathode electrode and an anode electrode of the reverse conducting diode region 101 consisting of a P-N-N+ layer are in common with an anode electrode 106 and a cathode electrode 107 of the self-extinguishing thyristor region 103 consisting of a P-N+-N-P-N layer respectively.

BACKGROUND ART 3

FIG. 22 is a plan view of a reverse conducting thyristor device of background art 3. In this background art 3, a self-extinguishing thyristor region 103 is arranged on the innermost region of a semiconductor substrate and a high-resistance region 102 and a reverse conducting diode region 101 are formed toward an outer region of the semiconductor substrate contrarily to the background and prior art 1 or 2, while the outer peripheral end of this substrate is engaged in a concave portion of end field protective rubber 104. Further, an external takeout gate electrode 105 is provided on an outer portion of the self-extinguishing thyristor region 103. FIG. 23 is a longitudinal sectional view of the reverse conducting thyristor device of the background art 3 related to the line A–A' in FIG. 22, and both electrodes of a cathode and an anode of the reverse conducting diode region 101 consisting of a P-N-N+ layer are in common with an anode electrode 106 and a cathode electrode 107 of the self-extinguishing thyristor region 103 consisting of a P-N+-N-P-N layer respectively.

PROBLEMS OF BACKGROUND AND PRIOR ART 1 to 3 i) When comparing loss caused in the reverse conducting diode region 101 and the self-extinguishing thyristor region 103 in a general operation, loss in recovery takes a leading part in the diode while power loss at a turn-on time and a turn-off time takes a leading part in the case of the self-extinguishing thyristor, and hence the self-extinguishing thyristor region 103 causes considerably large loss as compared with the reverse conducting diode region 101.

In the reverse conducting thyristor device having the structure of the background and prior art 1 or 2, therefore, there is such a problem that loss caused in the self-extinguishing 94 thyristor region 103 located on the outer side of the semiconductor substrate in the general operation is large and hence heat generated by this power loss fills the end field protective rubber 104 to deteriorate the characteristics of this rubber 104.

ii) When the external takeout gate electrode region 105 is arranged on the intermediate region of the semiconductor substrate as in the background art 1 or 3, it is necessary to form a takeout terminal portion on a sheath storing the semiconductor substrate for implementing connection of the external takeout gate electrode and the outside through this takeout terminal portion, in order to connect the external takeout gate electrode with the outside. At this time, it is necessary to provide the sheath with a takeout terminal portion having a shape projecting toward the central axis of the semiconductor substrate so that the takeout terminal portion of the sheath is not in contact with the cathode electrode 107 of the self-extinguishing thyristor region 103 in the background art 1 or so that this terminal portion is not in contact with the cathode electrode 107 of the reverse conducting diode region 101 in the case of the background art 3. In the reverse conducting thyristor device having the structure of the background art 1 or 3, therefore, there is such a problem that the structure of the sheath storing the semiconductor substrate is complicated and the sheath becomes high-priced.

Such problems (i) and (ii) are common not only in a GTO thyristor (the case where a gate terminal is lead-shaped) having a built-in reverse conducting diode but also in a device having a GCT (Gate Commutated Turn-off) thyristor whose gate terminal consists of a ring-shaped metal plate and a reverse conducting diode. The structure and the operating principle of the GCT thyristor are disclosed in Japanese Pat. Laying-Open Gazette No. 9-201039 (EPO785627A2).

DISCLOSURE OF INVENTION

The present invention has been proposed in order to solve the aforementioned problems (i) and (ii), and aims at providing a reverse conducting thyristor device, a pressure-connection type semiconductor device and a semiconductor substrate in which generated heat resulting from power loss in a self-extinguishing thyristor region will not fill end field protective rubber provided on an outer peripheral end portion of a semiconductor substrate and the structure of a sheath storing the semiconductor substrate can also be simplified at the same time.

A first aspect of the present invention comprises a semiconductor substrate, a self-extinguishing thyristor region, formed in the said semiconductor substrate, structuring a self-extinguishing thyristor comprising a gate part layer, a gate electrode region comprising an upper layer region of the same conductivity type as the said gate part layer, formed in an outer peripheral region of the said semiconductor substrate along the outer periphery of the said semiconductor substrate to enclose the said self-extinguishing thyristor region with an external takeout gate electrode formed on its surface, at least one connecting region, formed in the said semiconductor substrate, comprising a surface region of the same conductivity type as the said gate part layer and connecting the said gate part layer and the said upper layer region with each other through the said surface region, at least one isolation region, formed in the said semiconductor substrate, completely enclosed with the said self-extinguishing thyristor region, the said gate electrode region and the said connecting region, and at least one reverse conducting diode region, formed in the said semiconductor substrate, whose outer peripheral portion is completely enclosed with the said isolation region for structuring a reverse conducting diode, and is characterized in that the said isolation region comprises an isolation structure for electrically isolating the said self-extinguishing thyristor region and the said reverse conducting diode region.

According to the first aspect, the outer peripheral portion of the reverse conducting diode region is entirely enclosed with the isolation region, and the gate part layer and the upper layer region of the gate electrode region can be connected through the connecting region with low resistance. Further, the self-extinguishing thyristor region is arranged on an inner region of the semiconductor substrate, whereby it is possible to inhibit heat resulting from power loss in the self-extinguishing thyristor region from conducting to an end field protective rubber provided on the outermost peripheral region of the semiconductor substrate and filling the same.

A second aspect of the present invention is a reverse conducting thyristor device described in the first aspect, and characterized in that the said connecting region has a plurality of connecting regions, the said isolation region has a plurality of isolation regions, the said reverse conducting diode region also has a plurality of reverse conducting diode regions, each of the said plurality of isolation regions is enclosed with corresponding adjacent ones among the said plurality of connecting regions, the said self-extinguishing thyristor region and the said gate electrode region, and further the outer peripheral portion of each of the said plurality of reverse conducting diode regions is completely enclosed with a corresponding one among the said plurality of isolation regions.

According to the second aspect, the gate part layer is connected with the upper layer region of the gate electrode region on the outermost peripheral side through the plurality of connecting regions, whereby the gate part layer can be connected to the upper layer region with lower resistance.

A third aspect of the present invention is the reverse conducting thyristor device described in the second aspect, and further comprises the said external takeout gate electrode entirely formed on the said surface of the said upper layer region, a gate electrode formed on a surface of the said gate part layer, and a gate wiring pattern formed on a surface of the said surface region of each of the said plurality of connecting regions and connecting the said gate electrode and the said external takeout gate electrode with each other.

According to the third aspect, the gate electrode can be connected with the external takeout gate electrode located along the outer periphery on the outermost peripheral side of the substrate through the gate wiring patterns on the substrate with the same potential. Therefore, connection between the outside and the gate electrode can be readily enabled simply by only contact between the external takeout gate electrode on the outermost peripheral side of the substrate and a takeout portion on a sheath side without performing specific alignment when storing the reverse conducting thyristor device according to this aspect in the sheath. Thus, the structure of the sheath can be simplified.

A fourth aspect of the present invention is the reverse conducting thyristor device described in the third aspect, and characterized in that the respective ones of the said plurality of reverse conducting diode regions line up around a central axis of the said semiconductor substrate along the same ciruemferential direction at equal intervals.

According to the fourth aspect, the plurality of reverse conducting thyristor regions are uniformly divided, whereby stable turn-on and turn-off characteristics can be obtained.

A fifth aspect of the present invention is the reverse conducting thyristor device described in the fourth aspect, and is characterized in that the said self-extinguishing thyristor region corresponds to the innermost region of the said semiconductor substrate including the said central axis of the said semiconductor substrate.

According to the fifth aspect, the self-extinguishing thyristor region is provided on the innermost region in the substrate, whereby influence on the substrate outer peripheral region side by heat generated in this region can be further suppressed.

A sixth aspect of the present invention is the reverse conducting thyristor device described in the first aspect, and characterized in that the said isolation region corresponds to a first isolation region, the said isolation structure corresponds to a first isolation structure, the said reverse conducting diode region corresponds to a first reverse conducting diode region structuring a first reverse conducting diode, and the said reverse conducting thyristor device further comprises a second reverse conducting diode region, structuring a second reverse conducting diode, formed in a region of the said semiconductor substrate inward beyond the said self-extinguishing thyristor region, and a second isolation region formed in a region of the said semiconductor substrate held between the said second reverse conducting diode region and the said self-extinguishing thyristor region and comprising a second isolation structure for electrically isolating the said second reverse conducting diode region and the said self-extinguishing thyristor region.

According to the sixth aspect, an advantage similar to the first aspect is attained also in the case of a structure holding the self-extinguishing thyristor region with the first and second reverse conducting diode regions.

A seventh aspect of the present invention comprises the said reverse conducting thyristor device described in the third aspect, a ring-shaped end field protective member comprising a concave portion formed on its inner peripheral side surface part side so that a part excluding a part formed with the said external takeout gate electrode in the said gate electrode region of the said semiconductor substrate is engaged in the said concave portion, a ring gate whose lower surface is electrically in contact with the said external takeout gate electrode and a gate terminal whose first end portion is electrically in contact with an upper surface of the said ring gate and whose second end portion is extended toward the outside.

According to the seventh aspect, it is possible to prevent the end field protective member from being influenced by heat generated in the self-extinguishing thyristor region while takeout of the gate electrode to the outside can be completed by simply bringing the ring gate into contact with the external takeout gate electrode with no requirement for specific alignment, provision of a specific structure on a sheath of a pressure-connection type semiconductor device is made unnecessary and the sheath can be simplified.

An eighth aspect of the present invention comprises a self-extinguishing thyristor region structuring a self-extinguishing thyristor and comprising a gate part layer, a gate electrode region formed on an outer peripheral region and enclosing the said self-extinguishing thyristor region, a reverse conducting diode region formed as a reverse conducting diode in a region held between the said self-extinguishing thyristor region and the said gate electrode region, first and second connecting means for connecting the said gate part layer and an uppermost layer of the said gate electrode region which is of the same conductivity type as the said gate part layer to the same potential and isolation means for performing isolation between the said reverse conducting diode region and the said gate electrode region, isolation between the said reverse conducting diode region and the said first connecting means, isolation between the said reverse conducting diode region and the said second connecting means and isolation between the said reverse conducting diode region and the said self-extinguishing thyristor region.

According to the eighth aspect, a semiconductor substrate having an advantage similar to the first aspect can be obtained.

Objects, features, aspects and advantages of the present invention are described in detail inclusive of those described above and other ones in conjunction with the accompanying drawings.

BRIEF DESCRIPTION OF DRAWINGS

FIG. 2 is a sectional view showing the reverse conducting thyristor device according to the embodiment 1 of the present invention.

FIG. 6 is a plan view showing the reverse conducting thyristor device according to the embodiment 1 of the present invention.

BEST MODE FOR CARRYING OUT THE INVENTION

Embodiment 1

Figure 1:
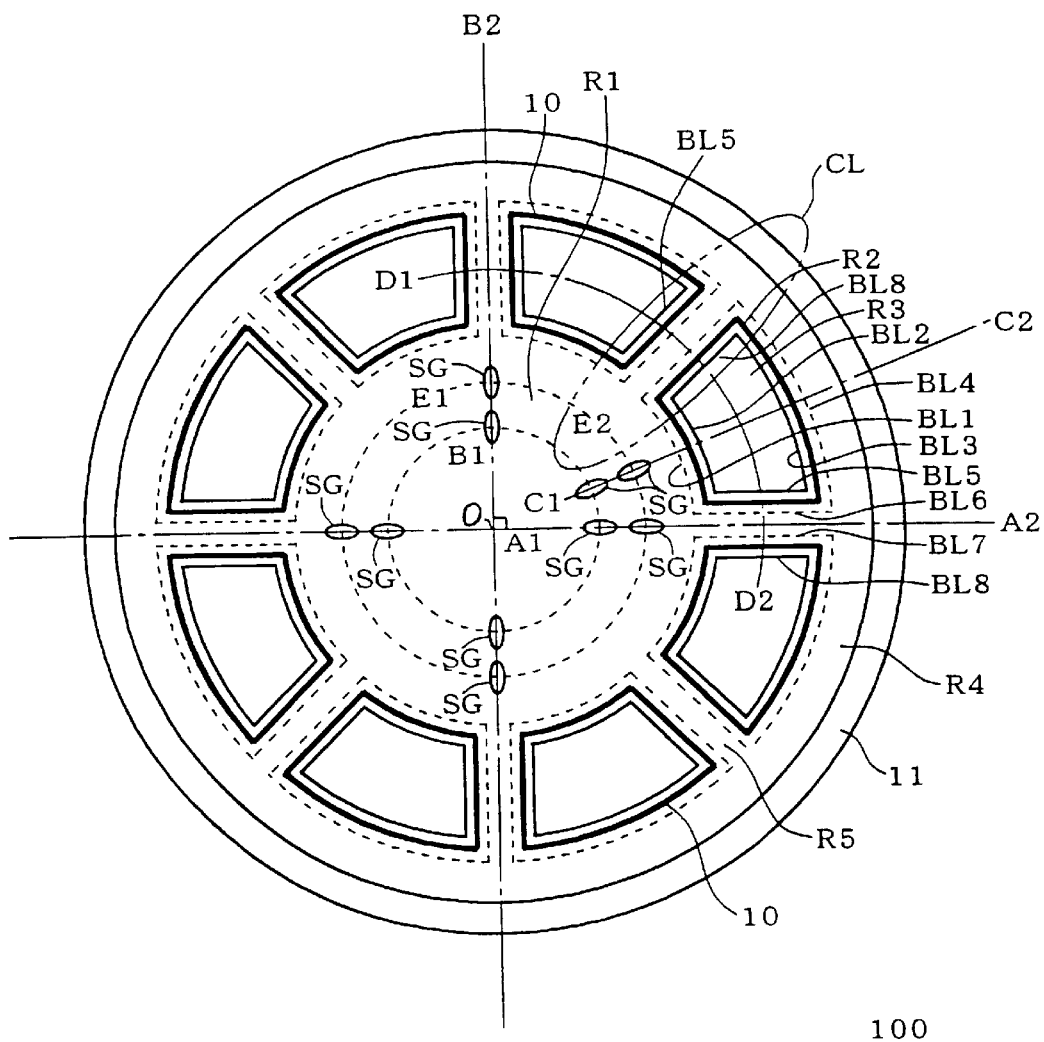
FIG. 1 is a plan view showing a reverse conducting thyristor device according to an embodiment 1 of the present invention.
Figure 3:
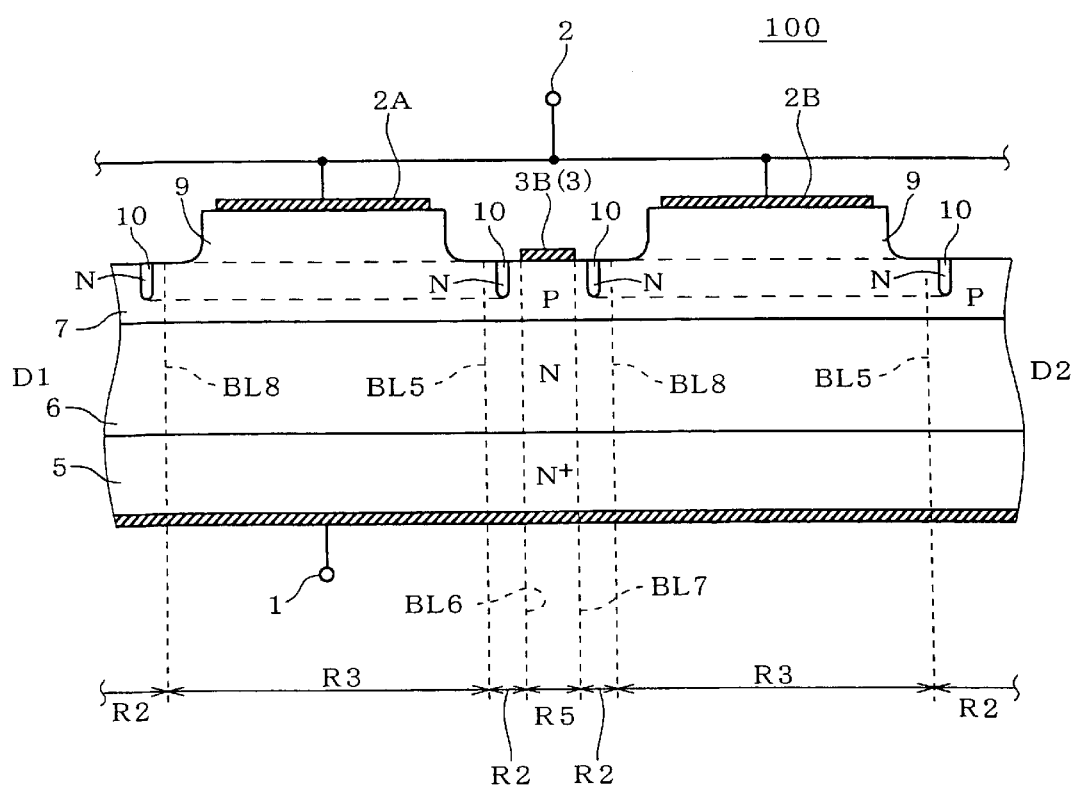
FIG. 3 is a sectional view showing the reverse conducting thyristor device according to the embodiment 1 of the present invention.
Figure 4:
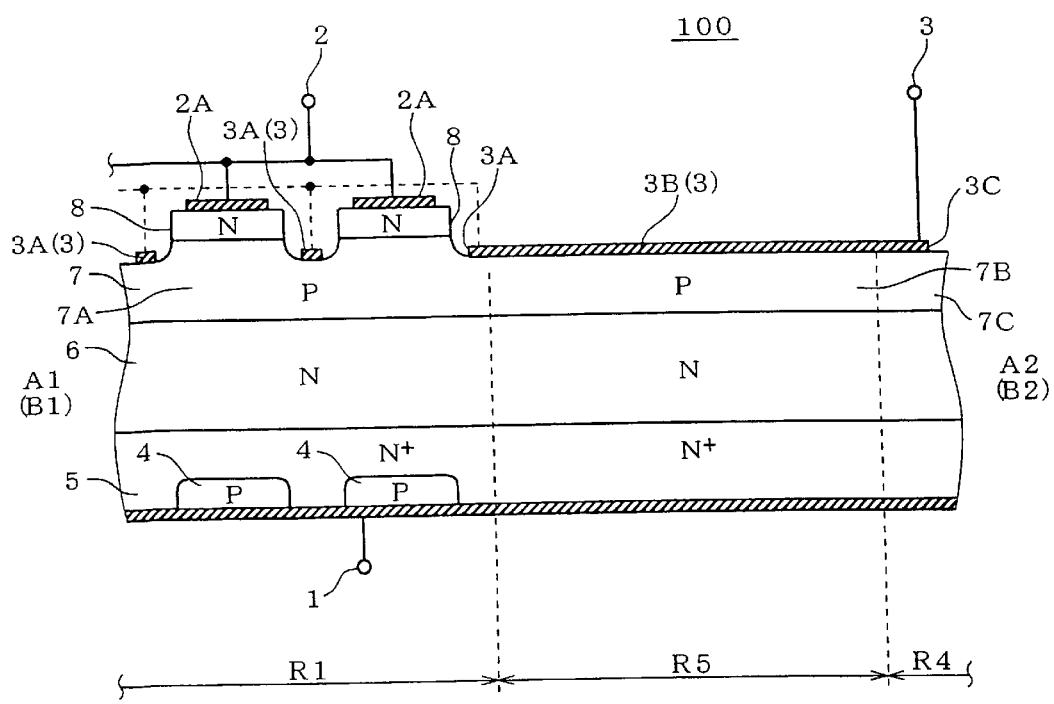
FIG. 4 is a sectional view showing the reverse conducting thyristor device according to the embodiment 1 of the present invention.
Figure 5:
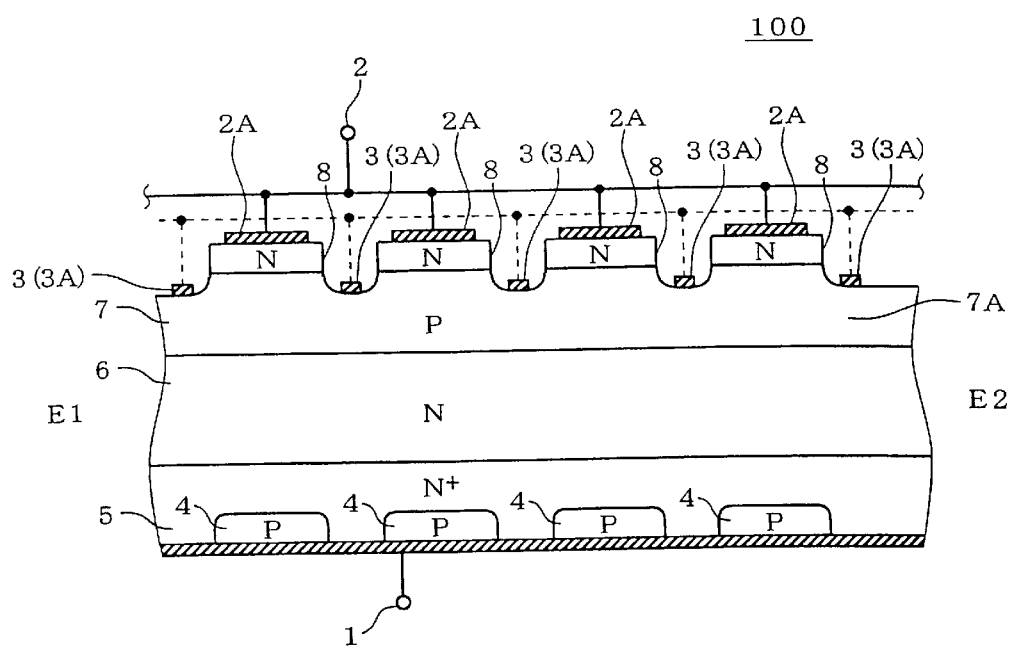
FIG. 5 a sectional view showing the reverse conducting thyristor device according to the embodiment 1 of the present invention.

FIG. 1 is a plan view showing the structure of a reverse conducting thyristor device 100 according to an embodiment 1. FIG. 2 is a longitudinal sectional view related to the line C1–C2 shown in FIG. 1, FIG. 3 is a longitudinal sectional view related to the line D1–D2 shown in FIG. 1, FIG. 4 is a longitudinal sectional view related to the line A—A or the line B1–B2 o f FIG. 1, FIG. 5 is a longitudinal sectional view related to the line E1–E2 of FIG. 1, and FIG. 6 is a plan view showing a part enclosed with a two-dot chain line CL in FIG. 1 in an enlarged manner. On the basis of these drawings, the structure of this device 100 is described below.

In an inner region of a semiconductor substrate (it is assumed that a silicon wafer is employed here), a self-extinguishing thyristor region Ri structuring a self-extinguishing thyristor is arranged on an innermost region including a central axis of this substrate passing through a central point O. The self-extinguishing thyristor may be a GCT thyristor, in addition to the already described GTO thyristor. It is assumed that, when saying "region" in this embodiment, it always means a three-dimensional region. As shown in FIG. 1, a plurality of segments SG are formed in the diametral direction from the central point O and concentrically on this region R1. The structure of each segment SG is as shown in FIG. 2, FIG. 4 and FIG. 5. That is, P layers 4 are partially formed from a surface of an N+ layer 5 toward the inner part, an N layer 6 is formed on an opposite surface of the N+ layer 5, a P layer 7 is formed on the N layer 6, and convex or mesa N layers 8 are formed on a surface of the P layer 7. On surfaces of the P layers 4 and the N+ layer 5, i.e., on an anode-side surface of this semiconductor substrate, an anode electrode 1 is entirely provided. Further, a cathode electrode 2 (2A) is formed on a surface of each N layer 8, and a gate electrode 3A is arranged on a surface of the P layer 7 between the adjacent N layers 8 to enclose the outer peripheries of the N layers 8 (refer to FIG. 6). Due to this structure, the segments SG consisting of P-N+-N-P-N layers are arranged on the region R1.

In this region R1, the P layer 7 defines a gate part layer 7A of the self-extinguishing thyristor.

On an outer peripheral region of the semiconductor substrate, on the other hand, an external takeout gate electrode region R4 is arranged along the outer periphery of this substrate to completely enclose the self-extinguishing thyristor region R1. This region R4 consists of the anode electrode 1, the N+ layer 5 provided on this electrode 1, the N layer 6 located on the N+ layer 5, the P layer 7 provided on the N layer 6 and an external takeout gate electrode 3C formed on a surface of the P layer 7 defining an upper layer region 7C of this region R4 along the outer periphery of this substrate substantially in the form of a ring.

Between the both regions R1 and R4 in this semiconductor substrate, reverse conducting diode regions R3 equally divided into eight, lining up along the same cirucmferential direction around the central axis at equal intervals, are arranged. Each region R3 consists of the anode electrode 1, the N+ layer 5, the N layer 6, the P layer 7, a mesa P layer 9 projecting from the P layer 7 and a cathode electrode 2 (2B) formed on a surface of the P layer 9, and structures a reverse conducting diode. Both cathode electrodes 2 of this region R3 and the region R1 are conducted to each other by pressure connection through a sheath member when sheathing the reverse conducting thyristor device 100 and structuring a pressure-connection type semiconductor device (refer to FIG. 7 described later). Therefore, FIG. 2 to FIG. 5 illustrate such a state that the respective cathode electrodes 2A and 2B are conducted to each other for convenience.

The outer peripheral portion of each of the aforementioned eight reverse conducting diode regions R3 is completely enclosed with an isolation region R2 of high resistance. Each of the isolation regions R2 is structured by the anode electrode 1, the N+ layer 5 on its upper portion, the N layer 6 on its upper portion, the P layer 7 corresponding to its upper layer, and an N layer 10 provided in the P layer 7 from the surface of the P layer 7, as shown in FIG. 2 and FIG. 3. The aforementioned N layer 10 forms an isolation structure for electrically isolating the self-extinguishing thyristor region R1 and the reverse conducting diode region R3. Thus, each isolation region R2 completely encloses the periphery of the corresponding reverse conducting diode region R3, while this region R2 forms boundaries with the self-extinguishing thyristor region R1 and the gate electrode region R4.

In addition, eight connecting regions R5 are provided between the adjacent isolation regions R2 and R2. In other words, the adjacent connecting regions R5 are arranged around the central axis of the semiconductor substrate at an angle of about 45 degrees, and the structure of each connecting region R5 is as follows:

That is, this region R5 consists of the anode electrode 1, the N+ layer 5 which is its upper layer portion, the N layer 6 which is its upper layer portion, the P layer 7 which is its upper layer portion and a gate wiring pattern 3B entirely formed on the surface of the P layer 7. This gate wiring pattern 3B is connected to the gate electrode 3A and the external takeout gate electrode 3C, as shown in FIG. 6. The gate electrode 3A, the gate wiring pattern 3B and the gate electrode 3C are thus integrated to electrically conduct, and hence these are generically referred to as a gate electrode 3.

As described above, each connecting region R5 has a surface region 7B which is a layer of the same conductivity type as the gate part layer 7A for connecting the gate part layer 7A and the upper layer region 7C of the region R4 with each other with low resistance and setting the same to the same potential.

When rephrasing the arrangement relation between the aforementioned respective regions R1 to R5, it can be said that each isolation region R2 is completely enclosed with the self-extinguishing thyristor region R1, the gate electrode region R4 and two connection regions R5.

Further, an end portion forming part of the outer peripheral region of the semiconductor substrate is engaged in a concave portion formed on an inner peripheral side surface part side of a ring-shaped end field protective member (rubber) 11 (refer to FIG. 7 described later).

Referring to FIG. 1 to FIG. 6, symbols BL1 to BL8 denote the following ones: That is, BL1 is the boundary surface between the self-extinguishing thyristor region R1 and the isolation region R2, BL2 is the boundary surface between the isolation region R2 and the reverse conducting diode region R3, BL3 is the boundary surface between the reverse conducting diode region R3 and the isolation region R2, BL4 is the boundary surface between the isolation region R2 and the gate electrode region R4, BL5 is the boundary surface between the reverse conducting diode region R3 and the isolation region R2, BL6 is the boundary surface between the isolation region R2 and the connecting region R5, BL7 is the boundary surface between the connecting region R5 and the isolation region R2, and BL8 is the boundary surface between the isolation region R2 and the reverse conducting diode region R3.

This reverse conducting thyristor device having the aforementioned structure attains the following effects (i) and (ii):

(i) The self-extinguishing thyristor region R1 remarkably generating heat is arranged on the innermost region including the central axis of the semiconductor substrate, whereby it is possible to prevent generated heat from filling the end field protective rubber 11.

(ii) Further, the outer peripheral portion of the reverse conducting diode region R3 arranged on the outer side of the self-extinguishing thyristor region R1 is completely enclosed with the isolation region R2, whereby it is possible to make necessity of providing a connecting mechanism for connecting the gate electrode 3A of the self-extinguishing thyristor region R1 to the external takeout gate electrode 3C on the sheath side unnecessary and connect both electrodes 3A and 3C with each other through the gate wiring pattern 3B provided on the surface of the connecting region R5 of the semiconductor substrate. In other words, it is possible to arrange the gate electrode region R4 and the gate electrode 3C for taking out the gate electrode 3A to the outside on the outer peripheral region which is the region on the outer side of the reverse conducting diode region R3 and is along the outer periphery. Also as to the sheath storing the semiconductor substrate, therefore, only a step structure or a recess structure (section is L-shaped) for providing a ring gate whose lower surface is in contact with the external takeout gate electrode 3C and a gate terminal whose first end portion is in contact with the upper surface of the ring gate and whose second end portion is extended toward the outside may be provided on its outer peripheral portion, and the structure of the sheath can be simplified. Further, the gate electrode region R4 is provided on the outer peripheral region part of the semiconductor substrate, whereby alignment of the sheath and the semiconductor substrate is also easy. That is, the aforementioned ring gate and the external takeout gate electrode 3C may simply be brought into contact with each other. FIG. 7 shows this point. Here, FIG. 7 is a sectional view showing the structure of a pressure-connection type semiconductor device manufactured by storing the semiconductor substrate or the reverse conducting thyristor device 100 in the sheath. In view of comparison, FIG. 8 shows the case of a conventional pressure-connection type semiconductor device.

Figure 7:
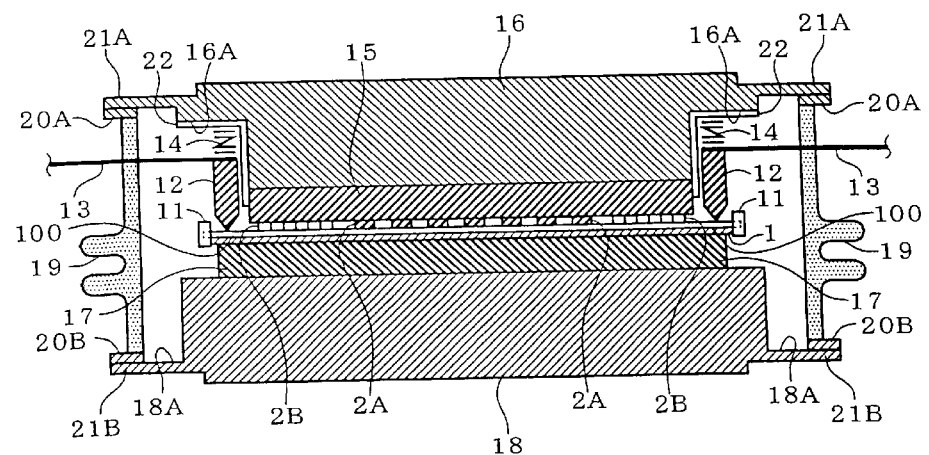
FIG. 7 is a sectional view of a pressure-connection type semiconductor device according to the present invention.
Figure 8:
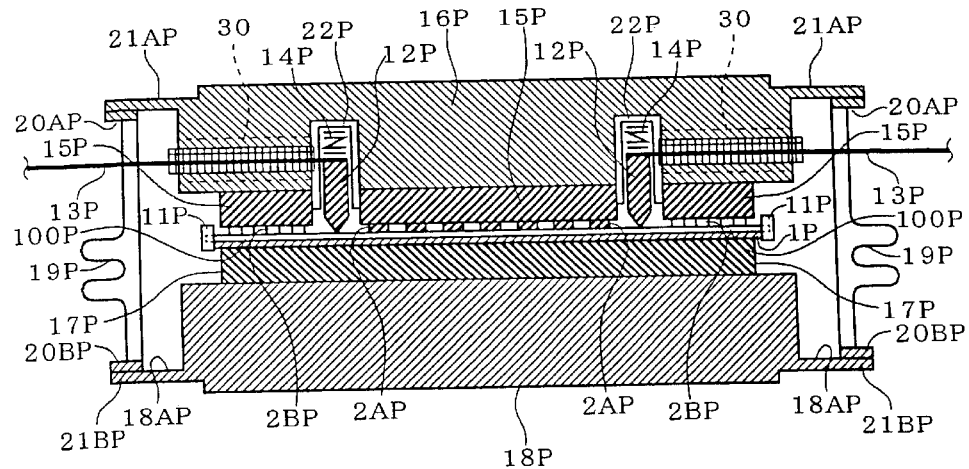
FIG. 8 is a sectional view of a conventional pressure-connection type semiconductor device.

In FIG. 7, each reference numeral denotes the following one:

That is, 15 and 16 are a cathode distortion buffer plate and a cathode post electrode successively loaded on the cathode electrode 2 (2A, 2B) of the semiconductor substrate respectively, and an anode distortion buffer plate 17 and an anode post electrode 18 are successively loaded on the anode electrode 1 on the back surface of the semiconductor substrate. 12 is a ring gate whose first surface (lower surface) is in surface contact with the external takeout gate electrode 3C of the semiconductor substrate, while 13 is a gate terminal and its inner peripheral side end portion is slidably arranged on a second surface (upper surface opposite to the aforementioned first surface) of the ring gate 12. Further, an elastic member 14 such as a plate spring or a wave spring presses the ring gate 12 against the gate electrode 3C through a non-illustrated annular insulator along with the aforementioned end portion of the gate terminal 13. Due to this pressing, the gate electrode 3C, the ring gate 12 and the gate terminal 13 are electrically connected with each other. Further, 22 is an insulating sheet for insulating the ring gate 12 from the opposed cathode distortion buffer plate 15 and the cathode post electrode 16. As to the insulating sheet 22, this may be structured as an integral substance as shown in FIG. 7, while this sheet 22 may be structured from a plurality of insulations in place of this.

On the other hand, 19 is an insulating cylinder consisting of ceramics (e.g., alumina), vertically divided through an intermediate portion of the gate terminal 13, further has a projection part on its outer peripheral side surface portion, and includes the semiconductor substrate and the respective principle parts 11, 12, 13, 14, 15, 17 and 22 in the cylinder. A fixing part of the gate terminal 13 and the insulating cylinder 19 are airtightly fixed to each other by brazed joint.

Further, an end portion 20A bent and projecting from the upper surface of the insulating cylinder 19 toward the outside and one end portion of a ring-shaped flange 21A are airtightly fixed by arc welding, and an end portion 20B projecting from the lower surface of the insulating cylinder 19 and one end portion of a flange 21B are also airtightly fixed similarly by arc welding. Other end portions of the flanges 21A and 21B are fixed to parts of recess portions 16A and 18A of the cathode post electrode 16 and the anode post electrode 18 respectively. Thus, this pressure-connection type semiconductor device is in a structure closed with respect to the outside. The inner part thereof is replaced with inert gas.

The pressure-connection type semiconductor device of FIG. 7 is pressed by non-illustrated current takeout stack electrodes from the upper and lower directions of the drawing.

While each reference numeral in FIG. 8 is that adding P to the corresponding reference numeral in FIG. 7, reference numeral 30 denotes a groove.

While this embodiment illustrates an example dividing/arranging the reverse conducting diode regions R3 equally into eight as shown in FIG. 1, each segment SG in the self-extinguishing thyristor region R1 has stable turn-on and turn-off characteristics as this number of equal division increases.

(Modification 1)

Figure 9:
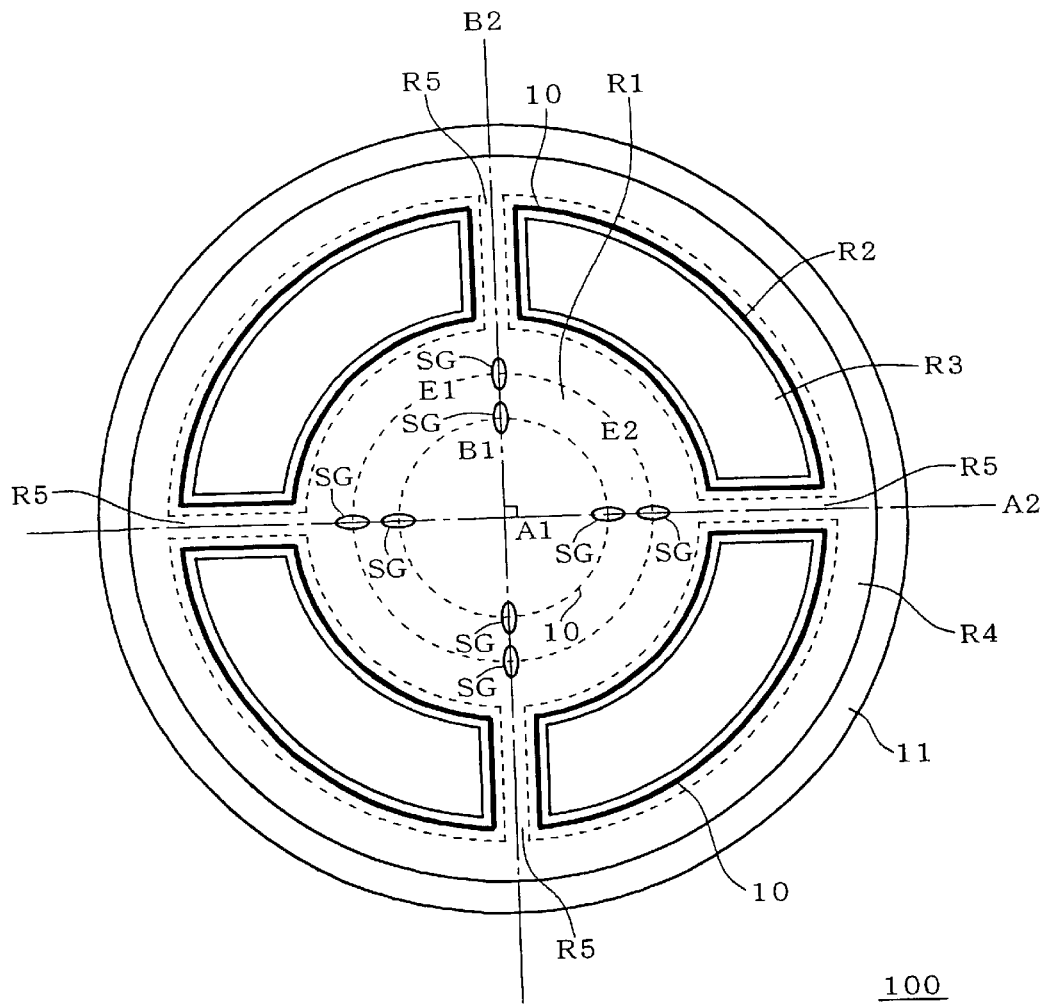
FIG. 9 is a plan view showing a reverse conducting thyristor device according to a modification 1 of the present invention.

FIG. 9 shows an example of the case of dividing/arranging reverse conducting diode regions R3 equally into four, and it is identical to the case of FIG. 1 to FIG. 6 in the remaining points. This modification also attains the aforementioned effects (i) and (ii).

(Modification 2)

Figure 10:
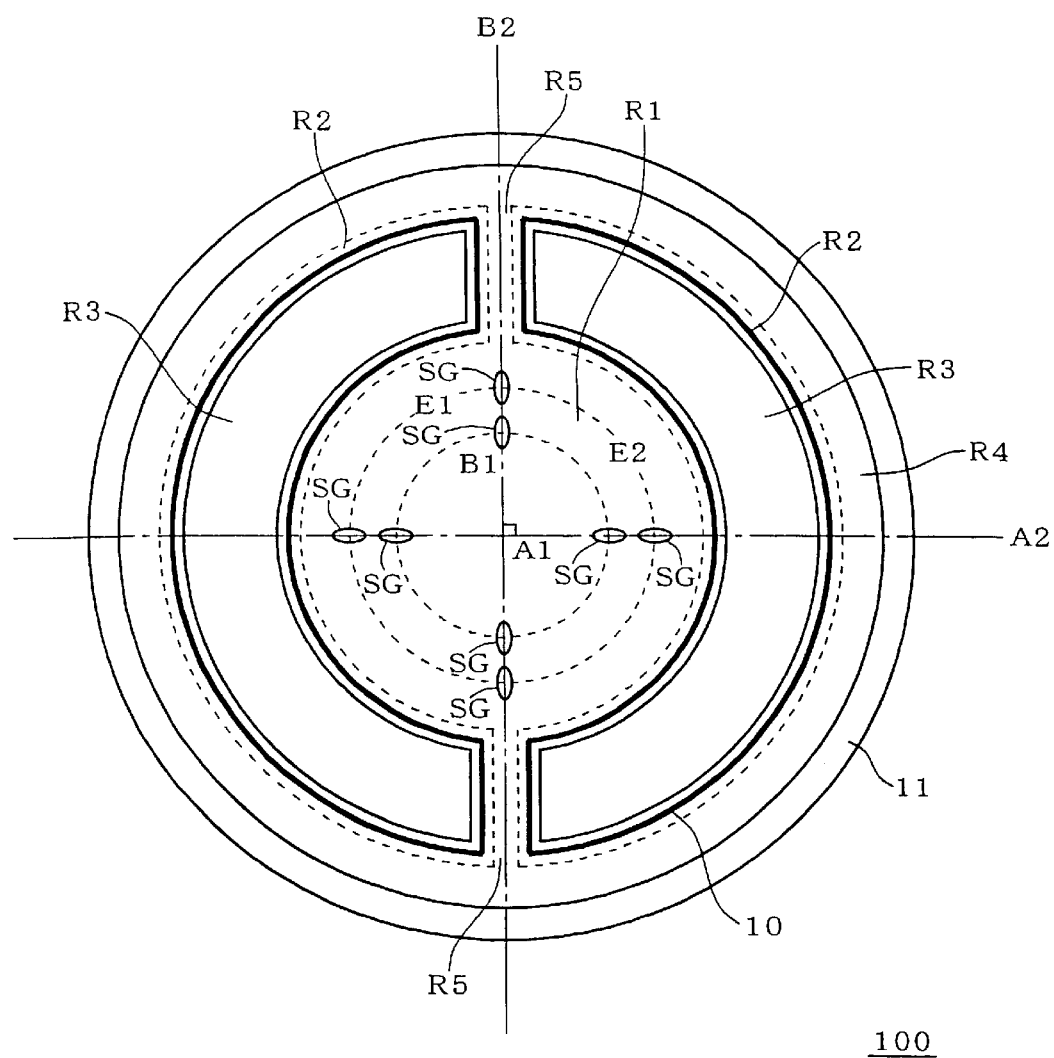
FIG. 10 is a plan view showing a reverse conducting thyristor device according to a modification 2 of the present invention.

FIG. 10 is a plan view showing an example arranging reverse conducting diodes R3 in a semiconductor substrate to equally divide the same into two, and the remaining structure is similar to the case of FIG. 1 to FIG. 6. This modification also similarly attains the aforementioned effects (i) and (ii).

(Modification 3)

Figure 11:
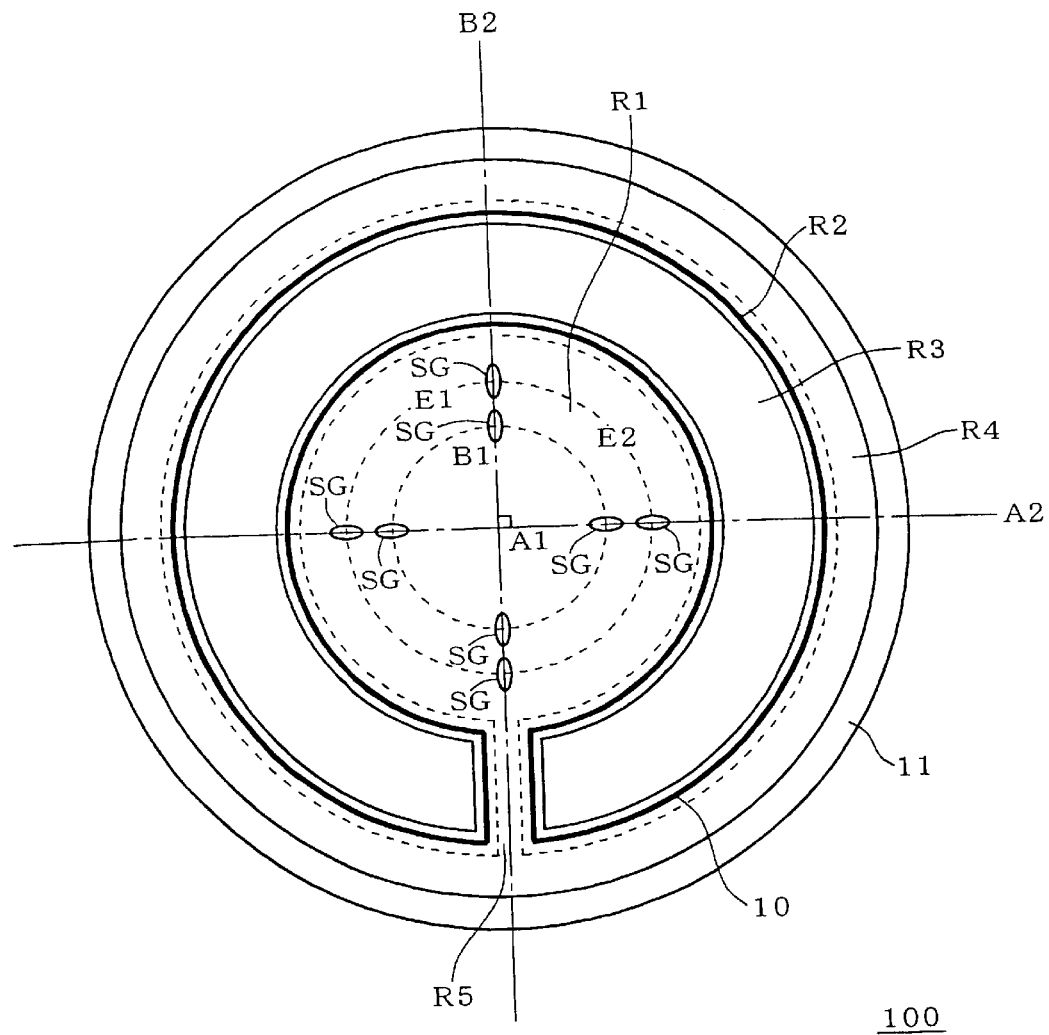
FIG. 11 is a plan view showing a reverse conducting thyristor device according to a modification 3 of the present invention.

FIG. 11 is a plan view showing an example providing one connecting region R5 in a semiconductor substrate while not dividing/arranging a reverse conducting diode region R3 and hence arranging one reverse conducting diode region R3 in the semiconductor substrate, and the remaining structure is similar to the case of FIG. 1 to FIG. 6. This modification also similarly attains the aforementioned effects (i) and (ii).

In this modification, the ratio occupied by the reverse conducting diode region R3 in the semiconductor substrate can be made larger than the embodiment 1 and the remaining modifications 1, 2, 4 and 5.

(Modification 4)

Figure 12:
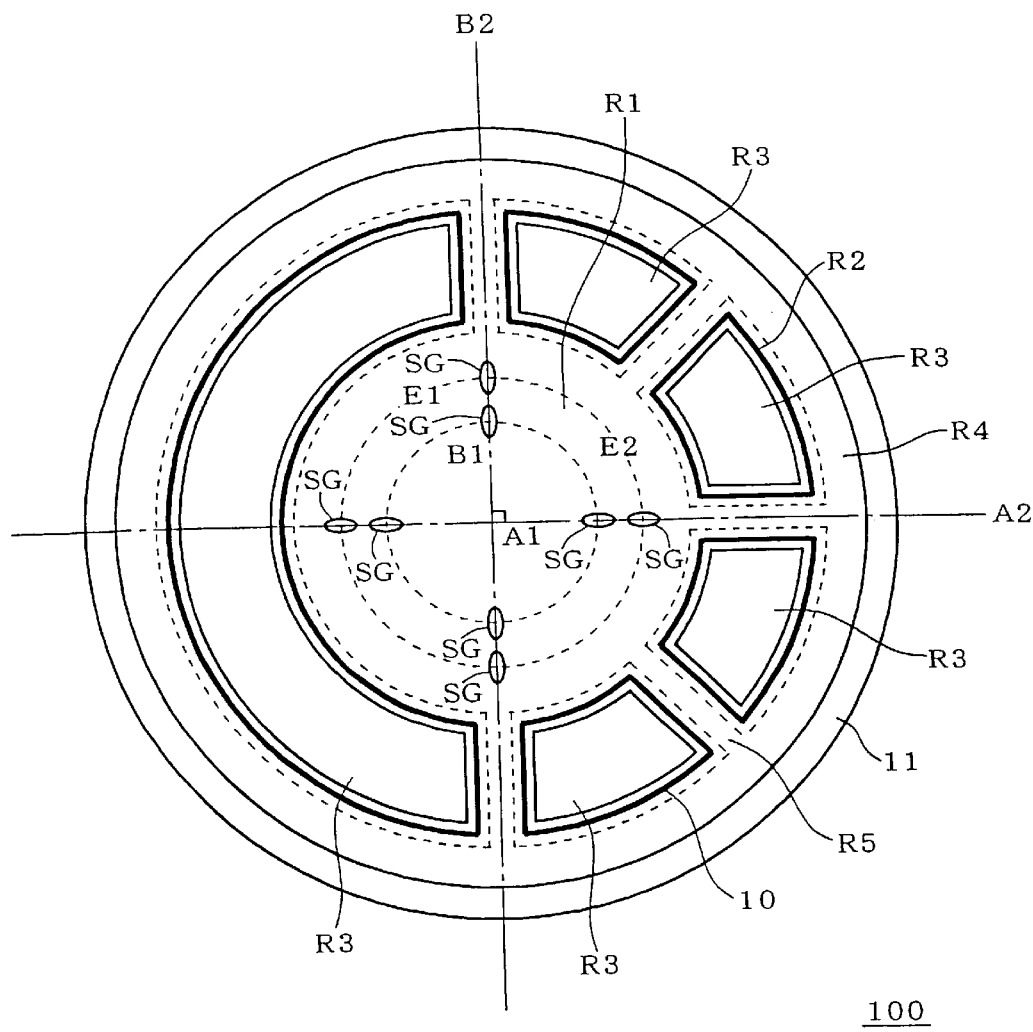
FIG. 12 is a plan view showing a reverse conducting thyristor device according to a modification 4 of the present invention.

FIG. 12 is a plan view showing an example in the case of unequally dividing/arranging reverse conducting diode regions R3, and the remaining structure is similar to the case of FIG. 1 to FIG. 6. This modification also similarly attains the aforementioned effects (i) and (ii).

(Modification 5)

Figure 13:
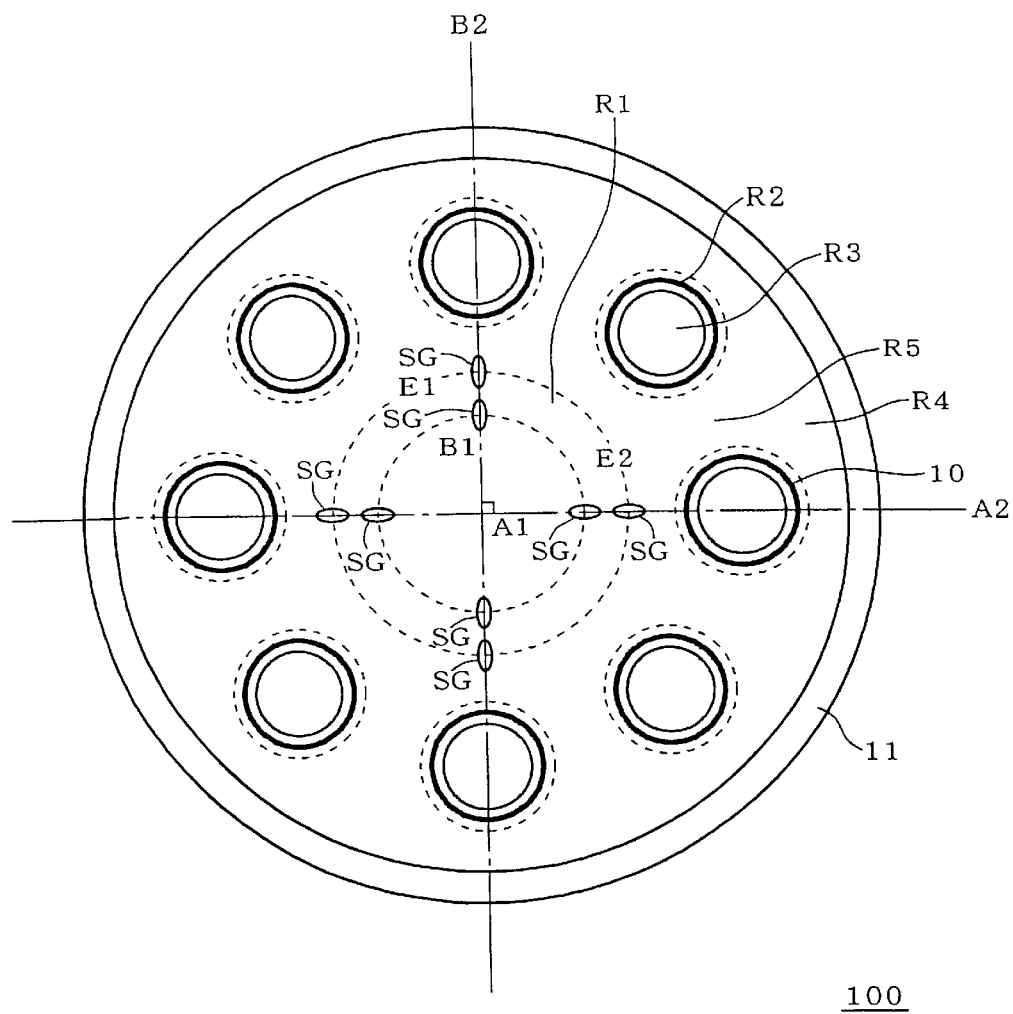
FIG. 13 is a plan view showing a reverse conducting thyristor device according to a modification 5 of the present invention.

FIG. 13 is a plan view showing a case of equally dividing reverse conducting diode regions R3 into eight and rendering the shape of each of the reverse conducting diode regions R3 a cylindrical shape (circular in the plan view), and the remaining structure is similar to the case of FIG. 1 to FIG. 6. This modification also similarly attains the aforementioned effects (i) and (ii).

Also when structuring the shape of each of the reverse conducting diode regions R3 in another shape, similar effects (i) and (ii) can of course be attained.

(Modification 6)

Figure 14:
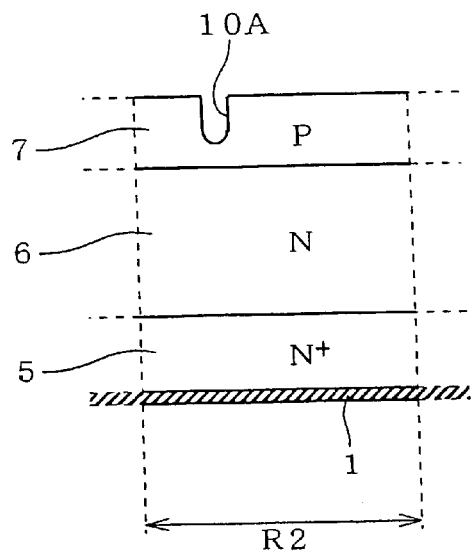
FIG. 14 is a plan view showing a reverse conducting thyristor device according to a modification 6 the present invention.
Figure 15:
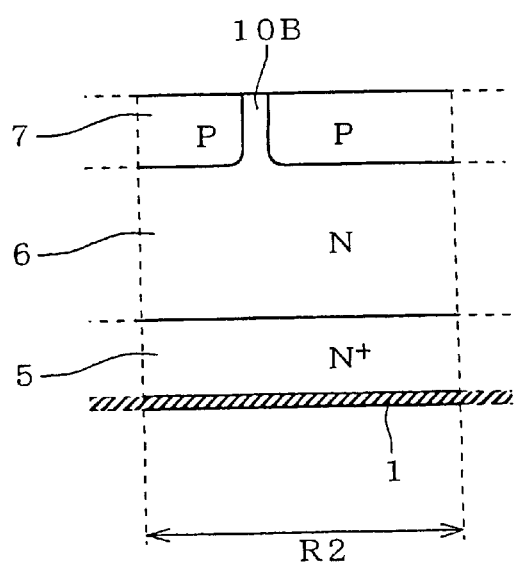
FIG. 15 is a plan view showing a reverse conducting thyristor device according to a modification 7 of the present invention.
Figure 16:
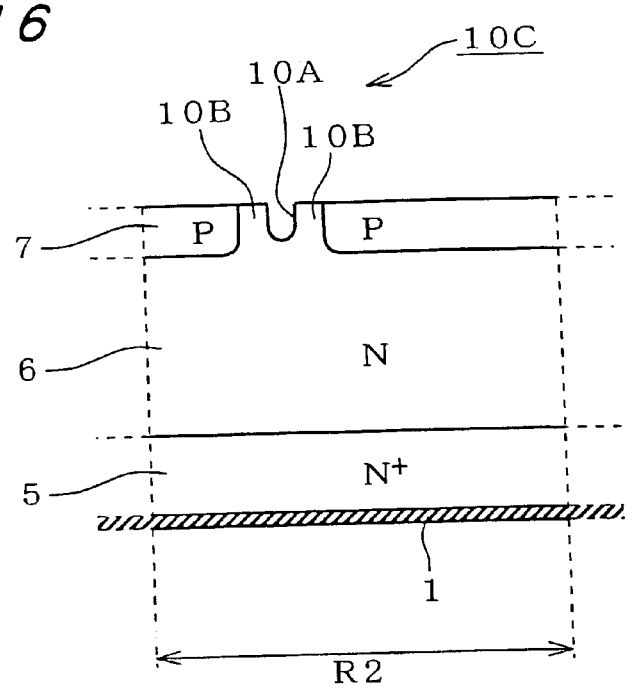
FIG. 16 is a plan view showing a reverse conducting thyristor device according to a modification 8 of the present invention.

While the isolation structure in the isolation region R2 is implemented by embedding the N layer 10 in the P layer 7 in the embodiment 1 as shown in FIG. 2, the isolation structure may be implemented by another structure, and a similar isolation effect is attained also in this case. For example, the isolation structure may be implemented by providing a groove 10A of a prescribed depth in the P layer 7, as shown in FIG. 14. Further, the isolation structure may be implemented by providing an N layer 10B connected with the N layer 6 in the P layer 7 as shown in FIG. 15, or the isolation structure may be implemented by a structure 10C further providing a groove 10A in the aforementioned N layer 10B as shown in FIG. 16.

(Modification 7)

While the outer peripheral portion of the reverse conducting diode region R3 has been completely enclosed with one isolation region R2 with respect to one reverse conducting diode region R3 in the embodiment 1, the outer peripheral portion of one reverse conducting diode region R3 may be completely enclosed in a multiple manner with a plurality of isolation regions R2.

Isolation regions R2 of structures different from each other may be combined in plural to completely enclose the outer peripheral portion of one reverse conducting diode region R3, and similar effects (i) and (ii) can be attained also in this case.

Embodiment 2

Figure 17:
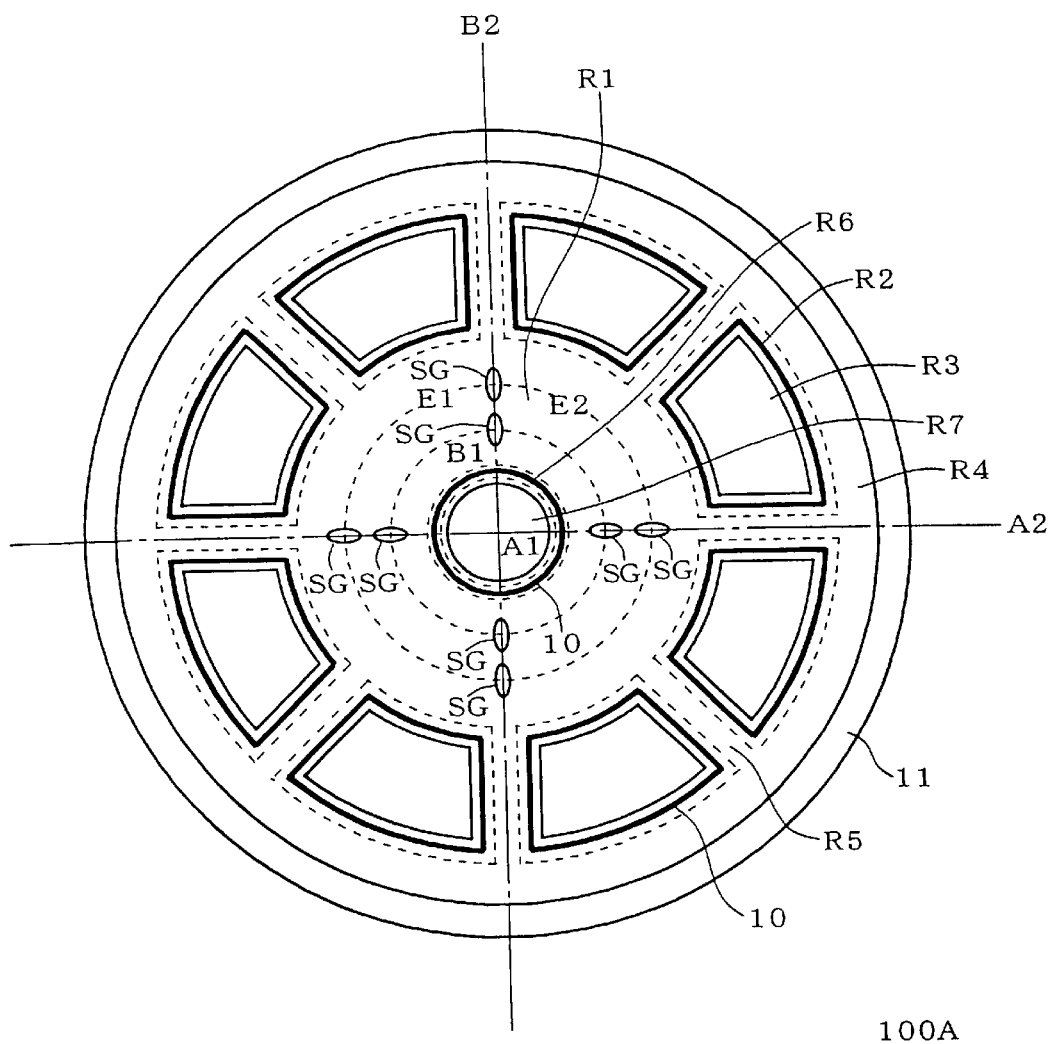
FIG. 17 is a plan view showing a reverse conducting thyristor device of an embodiment 2 of the present invention.
Figure 18:
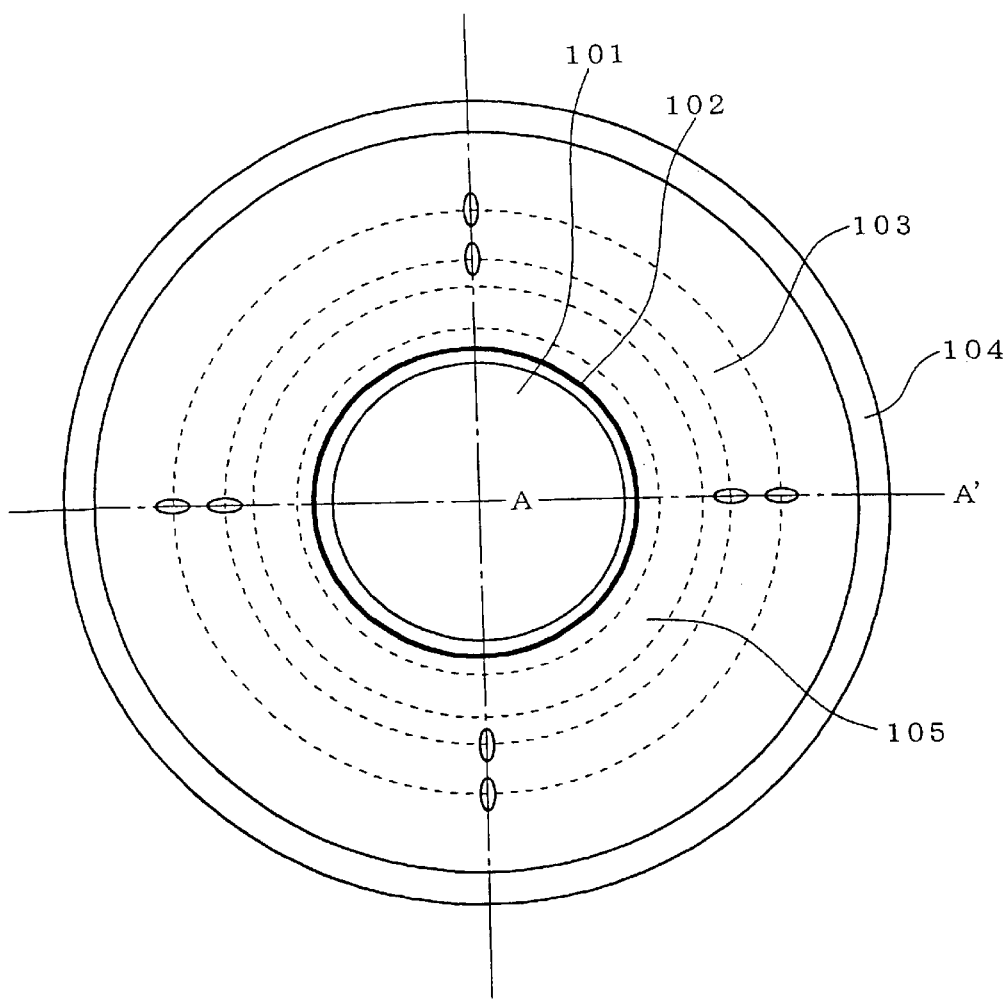
FIG. 18 is a plan view showing a reverse conducting thyristor device according to prior art 1.
Figure 19:
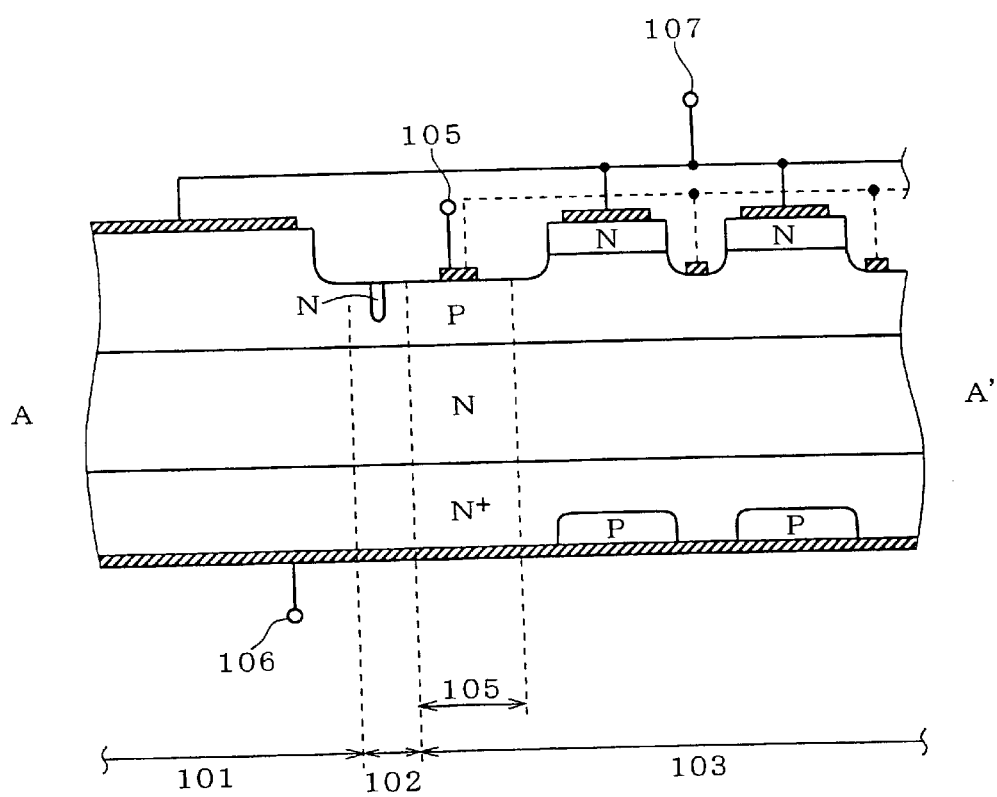
FIG. 19 is a sectional view showing the reverse conducting thyristor device according to the prior art 1.
Figure 20:
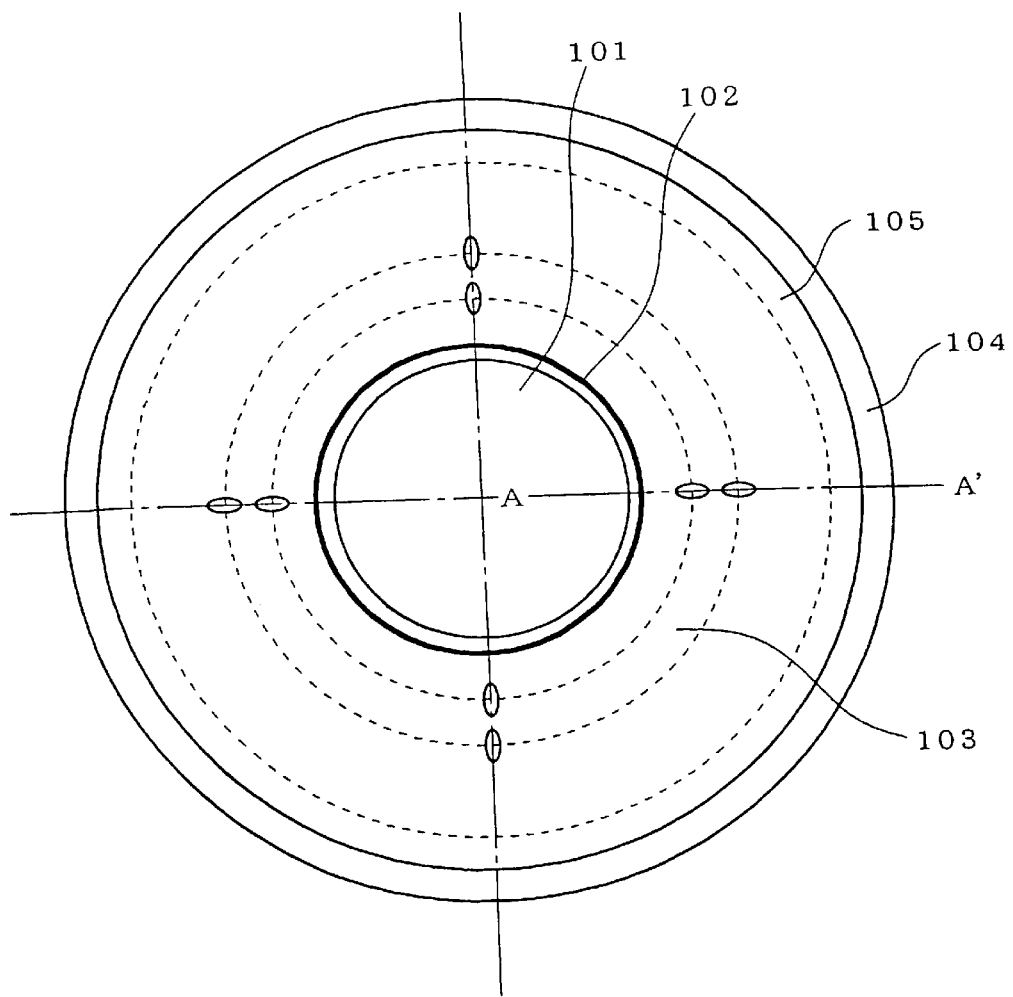
FIG. 20 is a plan view showing a reverse conducting thyristor device according to prior art 2.
Figure 21:
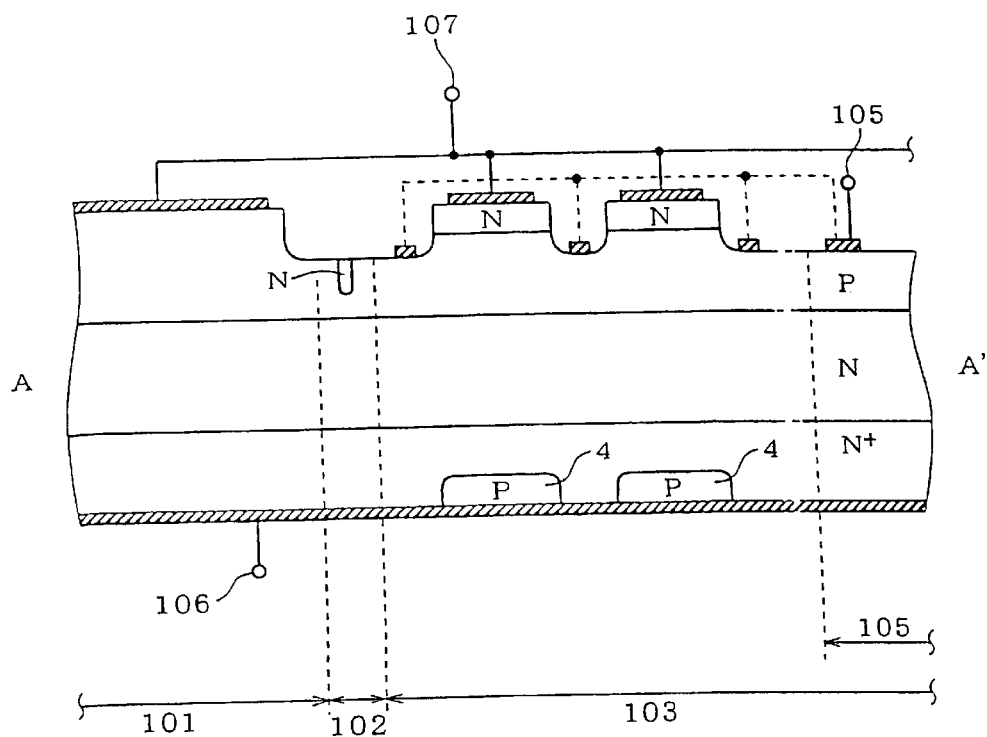
FIG. 21 is a sectional view showing the reverse conducting thyristor device according to the prior art 2.
Figure 22:
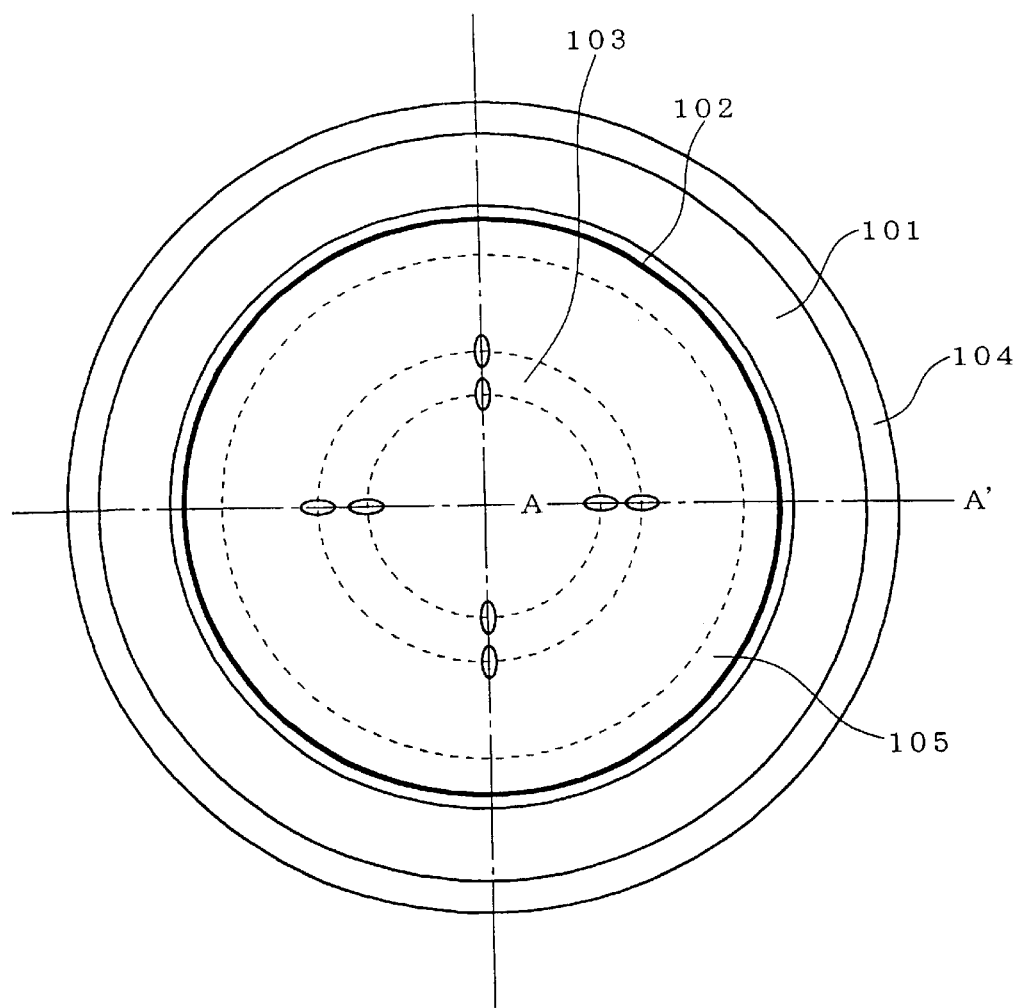
FIG. 22 is a plan view showing a reverse conducting thyristor device according to prior art 3.
Figure 23:
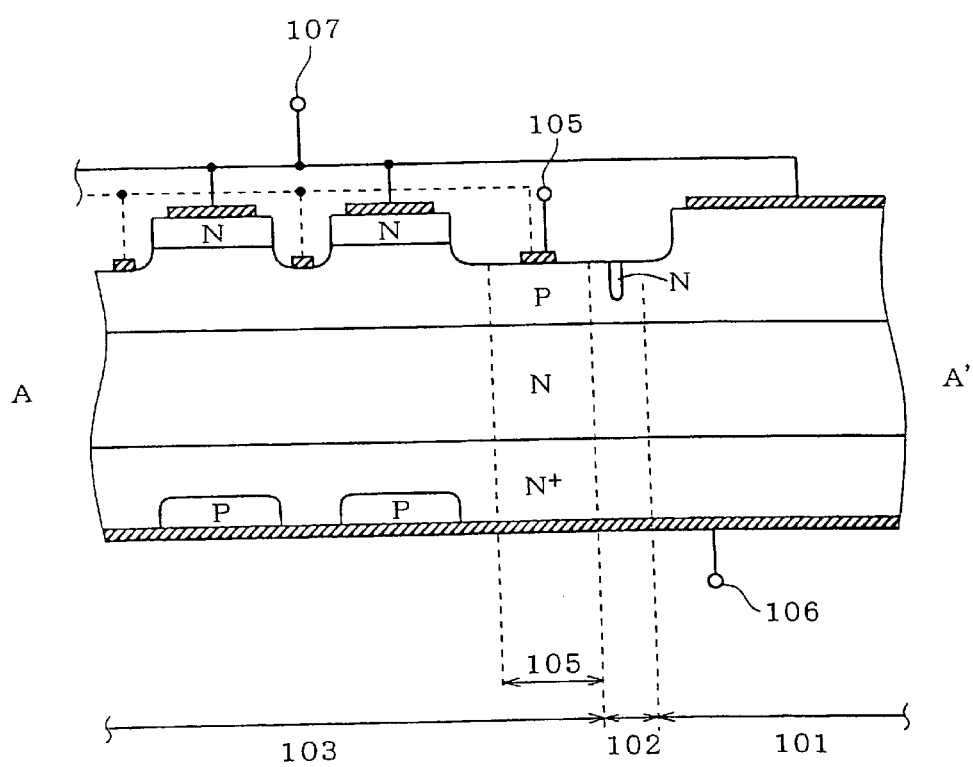
FIG. 23 is a sectional view showing the reverse conducting thyristor device according to the prior art 3.

FIG. 17 shows a plan view of a reverse conducting thyristor device 100A according to this embodiment. This drawing corresponds to the already described FIG. 1, and those of the same numerals denote the same ones.

As shown in FIG. 17, a characteristic point of this embodiment resides in a point further providing ① a second reverse conducting diode region R7 structuring a second reverse conducting diode, formed in a region of a semiconductor substrate inward beyond a self-extinguishing thyristor region R1 and ② a second isolation region R6 formed in a region of the semiconductor substrate held between the second reverse conducting diode region R7 and the self-extinguishing thyristor region R1 and comprising a second isolation structure for electrically isolating the second reverse conducting diode region R7 and the self-extinguishing thyristor region R1. In this case, that already described as the modification 6 may be employed as the second isolation structure, in addition to the N layer 10 shown in FIG. 1. The remaining points are similar to the case of the embodiment 1. Of course, it is possible to apply the already described modifications 1 to 5 and 7 to this embodiment.

It follows that isolation regions R2 correspond to first isolation regions, isolation structures 10 correspond to first isolation structures, and reverse conducting diode regions R3 correspond to first reverse conducting diode regions structuring first reverse conducting diodes.

Also according to this embodiment, effects (i) and (ii) similar to the embodiment 1 can be attained.

While embodiments of the present invention have been disclosed and described in detail, the foregoing description illustrates applicable aspects of the present invention, and the present invention is not restricted to this. That is, numerous modifications and variations for the described aspects can be devised in ranges without departing from the scope of the present invention.

What is claimed is:

1. A reverse conducting thyristor device comprising:
   a semiconductor substrate;
   a self-extinguishing thyristor region, formed in said semiconductor substrate, structuring a self-extinguishing thyristor comprising a gate part layer;
   a gate electrode region comprising an upper layer region of the same conductivity type as said gate part layer, formed in an outer peripheral region of said semiconductor substrate along the outer periphery of said semiconductor substrate to enclose said self-extinguishing thyristor region with an external takeout gate electrode formed on its surface;
   at least one connecting region, formed in said semiconductor substrate, comprising a surface region of the same conductivity type as said gate part layer and connecting said gate part layer and said upper layer region with each other through said surface region;
   at least one isolation region, formed in said semiconductor substrate, completely enclosed by, and in contact with, each of said self-extinguishing thyristor region, said gate electrode region, and said at least one connecting region; and
   at least one reverse conducting diode region, formed in said semiconductor substrate, whose outer peripheral portion is completely enclosed with said at least one isolation region for structuring a reverse conducting diode, wherein
      said at least one isolation region comprises an isolation structure for electrically isolating said self-extinguishing thyristor region.

2. A reverse conducting thyristor device comprising:
   a semiconductor substrate;
   a self-extinguishing thyristor region, formed in said semiconductor substrate, structuring a self-extinguishing thyristor comprising a gate part layer;
   a gate electrode region comprising an upper layer region of the same conductivity type as said gate part layer, formed in an outer peripheral region of said semiconductor substrate along the outer periphery of said semiconductor substrate to enclose said self-extinguishing thyristor region with an external takeout gate electrode formed on its surface;
   at least one connecting region, formed in said semiconductor substrate, comprising a surface region of the same conductivity type as said gate part layer and connecting said gate part layer and said upper layer region with each other through said surface region;
   at least one isolation region, formed in said semiconductor substrate, completely enclosed with said self-extinguishing thyristor region, said gate electrode region and said connecting region; and
   at least one reverse conducting diode region, formed in said semiconductor substrate, whose outer peripheral portion is completely enclosed with said isolation region for structuring a reverse conducting diode, wherein
      said isolation region comprises an isolation structure for electrically isolating said self-extinguishing thyristor region,
      said connection region has a plurality of connecting regions,
      said isolation region has a plurality of isolation regions,
      said reverse conducting diode region also has a plurality of reverse conducting diode regions,
      each of said plurality of isolation regions is enclosed with corresponding adjacent ones among said plurality of connecting regions, said self-extinguishing thyristor region and said gate electrode region, and further the outer peripheral portion of each of said plurality of reverse conducting diode regions is completely enclosed with a corresponding one among said plurality of isolation regions.

3. The reverse conducting thyristor device according to claim 2, further comprising:

said external takeout gate electrode entirely formed on said surface of said upper layer region, a gate electrode formed on a surface of said gate part layer, and a gate wiring pattern formed on a surface of said surface region of each of said plurality of connecting regions and connecting said gate electrode and said external takeout gate electrode with each other.

4. The reverse conducting thyristor device according to claim 3, wherein the respective ones of said plurality of reverse conducting diode regions line up around a central axis of said semiconductor substrate along the same cirucmferential direction at equal intervals.

5. The reverse conducting thyristor device according to claim 4, wherein said self-extinguishing thyristor region corresponds to the innermost region of said semiconductor substrate including said central axis of said semiconductor substrate.

6. A reverse conducting thyristor device, comprising:

a semiconductor substrate;

a self-extinguishing thyristor region, formed in said semiconductor substrate, structuring a self-extinguishing thyristor comprising a gate part layer;

a gate electrode region comprising an upper layer region of the same conductivity type as said gate part layer, formed in an outer peripheral region of said semiconductor substrate along the outer periphery of said semiconductor substrate to enclose said self-extinguishing thyristor region with an external takeout gate electrode formed on its surface;

at least one connecting region, formed in said semiconductor substrate, comprising a surface region of the same conductivity type as said gate part layer and connecting said gate part layer and said upper layer region with each other through said surface region;

at least one isolation region, formed in said semiconductor substrate, completely enclosed with said self-extinguishing thyristor region, said gate electrode region and said connecting region; and at least one reverse conducting diode region, formed in said semiconductor substrate, whose outer peripheral portion is completely enclosed with said isolation region for structuring a reverse conducting diode, wherein said isolation region comprises an isolation structure for electrically isolating said self-extinguishing thyristor region, said isolation region corresponds to a first isolation region, said isolation structure corresponds to a first isolation structure, and said reverse conducting diode region corresponds to a first reverse conducting diode region structuring a first reverse conducting diode, said reverse conducting thyristor device further comprising:

a second reverse conducting diode region, structuring a second reverse conducting diode, formed in a region of said semiconductor substrate inward beyond said self-extinguishing thyristor region, and a second isolation region formed in a region of said semiconductor substrate held between said second reverse conducting diode region and said self-extinguishing thyristor region and comprising a second isolation structure for electrically isolating said second reverse conducting diode region and said self-extinguishing thyristor region.

7. A pressure-connection type semiconductor device comprising:

said reverse conducting thyristor device according to claim 3;

a ring-shaped end field protective member comprising a concave portion formed on its inner peripheral side surface part side so that a part excluding a part formed with said external takeout gate electrode in said gate electrode region of said semiconductor substrate is engaged in said concave portion;

a ring gate whose lower surface is electrically in contact with said external takeout gate electrode; and a gate terminal whose first end portion is electrically in contact with an upper surface of said ring gate and whose second end portion is extended toward the outside.

8. A semiconductor substrate comprising:

a self-extinguishing thyristor region structuring a self-extinguishing thyristor comprising a gate part layer;

a gate electrode region formed in an outer peripheral region and enclosing said self-extinguishing thyristor region;

a reverse conducting diode region formed as a reverse conducting diode in a region held between said self-extinguishing thyristor region and said gate electrode region;

first and second connecting means for connecting said gate part layer and an uppermost layer of said gate electrode region being of the same conductivity type as said gate part layer to the same potential; and isolation means positioned between and in contact with both of said reverse conducting diode region and said gate electrode region for performing isolation between said reverse conducting diode region and said gate electrode region, positioned between and in contact with both of said reverse conducting diode region and said first connecting means for performing isolation between said reverse conducting diode region and said first connecting means, positioned between and in contact with both of said reverse conducting diode region and said second connecting means for performing isolation between said reverse conducting diode region and said second connecting means, and positioned between and in contact with both of said reverse conducting diode region and said self-extinguishing thyristor region for performing isolation between said reverse conducting diode region and said self-extinguishing thyristor region.

* * * * *